US012706591B2

(12) United States Patent
Goto et al.

(10) Patent No.: US 12,706,591 B2
(45) Date of Patent: Aug. 11, 2026

(54) SURFACE ACOUSTIC WAVE DEVICE WITH SHARED REFLECTOR AND TEMPERATURE COMPENSATION LAYER

(71) Applicant: Skyworks Solutions, Inc., Irvine, CA (US)

(72) Inventors: Rei Goto, Osaka (JP); Joji Fujiwara, Suita (JP); Kazuki Yamamura, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 48 days.

(21) Appl. No.: 19/005,231

(22) Filed: Dec. 30, 2024

(65) Prior Publication Data

US 2025/0233577 A1 Jul. 17, 2025

Related U.S. Application Data

(60) Provisional application No. 63/619,833, filed on Jan. 11, 2024, provisional application No. 63/619,850, filed on Jan. 11, 2024.

(51) Int. Cl.
*H03H 9/25* (2006.01)
*H03H 9/02* (2006.01)
(Continued)

(52) U.S. Cl.
CPC .......... *H03H 9/25* (2013.01); *H03H 9/02834* (2013.01); *H03H 9/145* (2013.01); *H03H 9/6483* (2013.01)

(58) Field of Classification Search
CPC .. H03H 9/25; H03H 9/02574; H03H 9/02834; H03H 9/6483; H03H 9/02559; H03H 9/14541; H03H 9/145; H03H 9/02228; H03H 9/02992; H03H 9/725; H03H 9/175; H03H 3/08; H03H 9/02102; H03H 9/173; H03H 9/1457; H03H 9/6406;
(Continued)

(56) References Cited

U.S. PATENT DOCUMENTS 8,084,915 B2 12/2011 Hamaoka et al.
8,421,307 B2 4/2013 Okamoto et al.
(Continued)

*Primary Examiner* — Andrea Lindgren Baltzell
*Assistant Examiner* — Tyler J Pereny
(74) *Attorney, Agent, or Firm* — VIA LLP

(57) ABSTRACT

A surface acoustic wave device can include a piezoelectric layer, first and second interdigital transducer electrodes in electrical communication with the piezoelectric layer, a reflector positioned between the first and second interdigital transducer electrodes such that the first and second interdigital transducer electrodes and the reflector are aligned along a longitudinal direction, and a temperature compensation layer over the first and second interdigital transducer electrodes and the reflector. The temperature compensation layer has a first region with a first thickness overlapping at least the first interdigital transducer electrode and a first portion of the reflector, a second region with a second thickness overlapping at least the second interdigital transducer electrode and a second portion of the reflector, and a sidewall between the first and second regions. The first thickness is greater than the second thickness. At least a portion of the sidewall extending non-perpendicular to the longitudinal direction.

20 Claims, 12 Drawing Sheets

(51) Int. Cl.
*H03H 9/145* (2006.01)
*H03H 9/64* (2006.01)

(58) Field of Classification Search
CPC ...... H03H 9/64; H03H 9/205; H03H 9/02015; H03H 9/6489; H03H 9/02858; H03H 9/6436; H03H 9/131; H03H 9/54; H03H 9/568; H03H 9/02637; H03H 9/02842; H03H 9/132; H03H 3/10; H03H 9/02818; H03H 9/02881; H03H 9/13; H03H 9/643; H03H 9/0211; H03H 9/02685; H03H 9/02889; H03H 9/14538; H03H 9/02157; H03H 9/0561; H03H 9/02661; H03H 9/14544; H03H 9/0009; H03H 9/1014; H03H 9/6469; H03H 9/1064; H03H 3/02; H04B 1/40; H04B 1/38; H04B 1/0057
See application file for complete search history.

(56) References Cited

U.S. PATENT DOCUMENTS 8,476,991 B2 7/2013 Goto et al.
8,487,720 B2 7/2013 Fujiwara et al.
8,698,578 B2 4/2014 Nakanishi et al.
8,994,472 B2 3/2015 Yamaji et al.
9,065,424 B2 6/2015 Nakanishi et al.
9,294,071 B2 3/2016 Yamaji et al.
9,419,584 B2 8/2016 Tsurunari et al.
9,425,766 B2 8/2016 Fujiwara et al.
9,473,107 B2 10/2016 Komatsu et al.
9,640,750 B2 5/2017 Nakanishi et al.
10,135,422 B2 11/2018 Goto et al.
10,530,331 B2 1/2020 Yamaji et al.
10,778,181 B2 9/2020 Goto et al.
10,931,260 B2 2/2021 Yamaji et al.
11,025,220 B2 6/2021 Fukuhara et al.
11,133,789 B2 9/2021 Maki et al.
11,431,319 B2 8/2022 Goto
11,444,599 B2 9/2022 Sasaki et al.
11,463,065 B2 10/2022 Goto
11,489,513 B2 11/2022 Goto
11,502,668 B2 11/2022 Goto
11,545,960 B2 1/2023 Goto
11,552,614 B2 1/2023 Caron et al.
11,588,465 B2 2/2023 Fukuhara et al.
11,652,466 B2 5/2023 Fujiwara
11,677,380 B2 6/2023 Fujiwara et al.
11,722,122 B2 8/2023 Goto et al.
11,750,172 B2 9/2023 Goto et al.
11,811,392 B2 11/2023 Hiramatsu et al.
11,870,421 B2 1/2024 Hiramatsu et al.
11,881,837 B2 1/2024 Caron et al.
11,909,377 B2 2/2024 Caron et al.
11,909,378 B2 2/2024 Caron et al.
11,923,822 B2 3/2024 Maki et al.
11,923,823 B2 3/2024 Fukuhara et al.
11,949,404 B2 4/2024 Goto
11,996,821 B2 5/2024 Goto et al.
12,009,797 B2 6/2024 Goto
12,063,026 B2 8/2024 Caron et al.
12,081,189 B2 9/2024 Maki et al.
12,149,224 B2 11/2024 Maki et al.
2010/0085134 A1 4/2010 Lee et al.
2015/0168209 A1* 6/2015 Tsuzuki ............ G01N 33/5438 73/632
2018/0159494 A1 6/2018 Goto et al.
2019/0044495 A1* 2/2019 Konno .................. H03H 9/145
2021/0159883 A1 5/2021 Kadota et al.
2022/0263495 A1 8/2022 Wang et al.
2022/0311410 A1 9/2022 Komatsu et al.
2022/0321088 A1 10/2022 Goto et al.
2022/0321096 A1 10/2022 Goto et al.
2023/0013597 A1 1/2023 Goto et al.
2023/0016884 A1 1/2023 Goto et al.
2023/0031568 A1 2/2023 Tang et al.
2023/0048476 A1 2/2023 Cheng et al.
2023/0055758 A1 2/2023 Goto et al.
2023/0070350 A1 3/2023 Goto
2023/0103956 A1 4/2023 Fukuhara et al.
2023/0104405 A1 4/2023 Hiramatsu et al.
2023/0104500 A1 4/2023 Fukuhara et al.
2023/0105034 A1 4/2023 Fukuhara et al.
2023/0107728 A1 4/2023 Fukuhara et al.
2023/0107820 A1 4/2023 Fukuhara et al.
2023/0108686 A1 4/2023 Fukuhara et al.
2023/0109106 A1 4/2023 Hiramatsu et al.
2023/0111476 A1 4/2023 Fukuhara et al.
2023/0120844 A1 4/2023 Goto et al.
2023/0123285 A1 4/2023 Goto et al.
2023/0198503 A1 6/2023 Goto
2023/0208398 A1 6/2023 Goto et al.
2023/0208399 A1 6/2023 Goto et al.
2023/0291385 A1 9/2023 Okamoto et al.
2023/0327630 A1 10/2023 Goto et al.
2023/0327642 A1 10/2023 Goto et al.
2023/0327645 A1 10/2023 Goto et al.
2023/0336146 A1 10/2023 Feld et al.
2023/0336147 A1 10/2023 Feld et al.
2023/0344411 A1 10/2023 Chen et al.
2023/0344415 A1 10/2023 Chen et al.
2023/0344416 A1 10/2023 Chen et al.
2023/0361755 A1 11/2023 Goto
2023/0378937 A1 11/2023 Goto et al.
2023/0412142 A1* 12/2023 Rath .................. H03H 9/02574
2024/0039507 A1 2/2024 Goto et al.
2024/0048125 A1 2/2024 Goto et al.
2024/0056049 A1 2/2024 Yamamura et al.
2024/0063773 A1 2/2024 Fukuhara et al.
2024/0088870 A1 3/2024 Goto et al.
2024/0178812 A1 5/2024 Goto et al.
2024/0178814 A1 5/2024 Goto et al.
2024/0243720 A1 7/2024 Caron et al.
2024/0258986 A1 8/2024 Hill et al.
2024/0267028 A1 8/2024 Ikeuchi et al.
2024/0356515 A1 10/2024 Goto
2024/0356516 A1 10/2024 Caron et al.
2024/0356518 A1 10/2024 Goto et al.
2024/0364305 A1 10/2024 Goto
2024/0396517 A1 11/2024 Goto

* cited by examiner 3
10
36
t1
14
46a
12
t2
18
46b
16
46c 10
36
20
14
24
46c
18
22 x
y 36b
36a
t2
t1
16
18
36c
12
14
36
10
50
4
x
y
22
24
20

36b
36a
36c
18
16
12
14
36
10
6
x
y 36c
22
18
24
14
20
36
10
x
y

ANT
L2
TS6
TS7
TP5
TS5
TS4
TP4
TS3
TP3
TS2
TP2
TS1
TP1
L1
TX
71

RX
L3
RS1
RP1
RS2
RP2
RS3
RS4
RP3
RS5
RP4
RS6
RP5
RP6
RS7
RS8
ANT
L2
72

SURFACE ACOUSTIC WAVE DEVICE WITH SHARED REFLECTOR AND TEMPERATURE COMPENSATION LAYER

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/619,833, filed Jan. 11, 2024, titled "SURFACE ACOUSTIC WAVE DEVICE WITH SHARED REFLECTOR," and U.S. Provisional Patent Application No. 63/619,850, filed Jan. 11, 2024, titled "WAVE SCATTERING STRUCTURE FOR SURFACE ACOUSTIC WAVE DEVICE WITH SHARED REFLECTOR," are hereby incorporated herein by reference under 37 CFR 1.57 in their entirety.

BACKGROUND

Technical Field

Embodiments of this disclosure relate to acoustic wave devices, and in particular, to surface acoustic wave devices with a shared reflector and a temperature compensation layer.

Description of Related Technology

A surface acoustic wave filter can include a plurality of surface acoustic wave resonators arranged to filter a radio frequency signal. Each resonator can include a surface acoustic wave device. Example piezoelectric MEMS resonators include surface acoustic (SAW) resonators and temperature compensated surface acoustic wave (TC-SAW) resonators. A surface acoustic wave device can be configured to generate, for example, a Rayleigh mode surface acoustic wave in which the main mode of the acoustic wave generated by the surface acoustic wave device is Rayleigh mode, or a shear horizontal mode surface acoustic wave in which the main mode of the acoustic wave generated by the surface acoustic wave device is shear horizontal mode.

Surface acoustic wave filters can be implemented in radio frequency electronic systems. For instance, filters in a radio frequency front end of a mobile phone can include surface acoustic wave filters. A plurality of acoustic wave filters can be arranged as a multiplexer. For example, two surface acoustic wave filters can be arranged as a duplexer. Transverse leakage generally degrades the performance of the surface acoustic wave device.

SUMMARY

The innovations described in the claims each have several aspects, no single one of which is solely responsible for its desirable attributes. Without limiting the scope of the claims, some prominent features of this disclosure will now be briefly described.

In some aspects, the techniques described herein relate to a surface acoustic wave device including: a piezoelectric layer; a first interdigital transducer electrode and a second interdigital transducer electrode in electrical communication with the piezoelectric layer; a reflector positioned between the first and second interdigital transducer electrodes such that the first interdigital transducer electrode, the second interdigital transducer electrode, and the reflector are aligned along a longitudinal direction; and a temperature compensation layer over the first interdigital transducer electrode, the second interdigital transducer electrode, and the reflector, the temperature compensation layer having a first region with a first thickness overlapping at least the first interdigital transducer electrode and a first portion of the reflector, a second region with a second thickness overlapping at least the second interdigital transducer electrode and a second portion of the reflector, and a sidewall between the first region and the second region, the first thickness being greater than the second thickness, at least a portion of the sidewall extending non-perpendicular to the longitudinal direction.

In some embodiments, the techniques described herein relate to a surface acoustic wave device wherein fingers of the reflector extend in a transverse direction perpendicular to the longitudinal direction.

In some embodiments, the techniques described herein relate to a surface acoustic wave device wherein the sidewall overlaps at least one finger of the fingers and one spacing between the finger and an adjacent finger.

In some embodiments, the techniques described herein relate to a surface acoustic wave device wherein the sidewall extends in a direction that is angled in a range between 1° and 15° from the transverse direction.

In some embodiments, the techniques described herein relate to a surface acoustic wave device wherein the sidewall has a plurality of angled sections that are angled relative to a respective adjacent section.

In some embodiments, the techniques described herein relate to a surface acoustic wave device wherein each section of the plurality of angled sections is angled relative to the transverse direction.

In some embodiments, the techniques described herein relate to a surface acoustic wave device wherein a difference between the first thickness and the second thickness is in a range between 100 nm and 500 nm.

In some embodiments, the techniques described herein relate to a surface acoustic wave device wherein a difference between the first thickness and the second thickness is in a range between 100 nm and 300 nm.

In some embodiments, the techniques described herein relate to a surface acoustic wave device wherein the sidewall is sloped from the first region to the second region.

In some embodiments, the techniques described herein relate to a surface acoustic wave device further including a third interdigital transducer electrode coupled longitudinally with the first and second interdigital transducer electrodes, and a second reflector between the second interdigital transducer electrode and the third interdigital transducer electrode.

In some embodiments, the techniques described herein relate to a surface acoustic wave device wherein the temperature compensation layer further includes a third region having a third thickness that overlaps at least the third interdigital transducer electrode and a portion of the second reflector, and a second sidewall between the second region and the third region, the third thickness is different from the second thickness.

In some embodiments, the techniques described herein relate to a surface acoustic wave device wherein the first and second interdigital transducer electrodes have different lateral sizes.

In some aspects, the techniques described herein relate to a surface acoustic wave device including: a piezoelectric layer; a first interdigital transducer electrode and a second interdigital transducer electrode in electrical communication with the piezoelectric layer; a reflector positioned between the first and second interdigital transducer electrodes, the reflector including a plurality of fingers extending in a first direction; and a temperature compensation layer over the first interdigital transducer electrode, the second interdigital transducer electrode, and the reflector, the temperature compensation layer having a first region with a first thickness overlapping at least the first interdigital transducer electrode and a first portion of the reflector, a second region with a second thickness overlapping at least the second interdigital transducer electrode and a second portion of the reflector, and a sidewall between the first region and the second region, the first thickness being different from the second thickness, at least a portion of the sidewall extending in a second direction non-parallel to the first direction.

In some embodiments, the techniques described herein relate to a surface acoustic wave device wherein the second direction is angled in a range between 1° and 15° from the first direction.

In some embodiments, the techniques described herein relate to a surface acoustic wave device wherein the sidewall overlaps at least one finger of the fingers and one spacing between the finger and an adjacent finger.

In some embodiments, the techniques described herein relate to a surface acoustic wave device wherein the sidewall has a plurality of angled sections that are angled relative to a respective adjacent section.

In some embodiments, the techniques described herein relate to a surface acoustic wave device wherein each section of the plurality of angled sections is angled relative to the first direction.

In some embodiments, the techniques described herein relate to a surface acoustic wave device wherein a difference between the first thickness and the second thickness is in a range between 100 nm and 500 nm.

In some embodiments, the techniques described herein relate to a surface acoustic wave device wherein the sidewall is sloped from the first region to the second region.

In some aspects, the techniques described herein relate to a surface acoustic wave device wherein the first and second interdigital transducer electrodes have different lateral sizes.

In some aspects, the techniques described herein relate to a surface acoustic wave device including: a piezoelectric layer; a first interdigital transducer electrode and a second interdigital transducer electrode in electrical communication with the piezoelectric layer; a reflector positioned laterally between the first and second interdigital transducer electrodes in a longitudinal direction, the reflector including fingers extending in a transverse direction perpendicular to the longitudinal direction; and a temperature compensation layer over the first interdigital transducer electrode, the second interdigital transducer electrode, and the reflector, the temperature compensation layer having a first region over the first interdigital transducer electrode and a first portion of the reflector, a second region over at least the second interdigital transducer electrode and a second portion of the reflector, and a sidewall between the first region and the second region, the sidewall overlapping at least one finger of the fingers and one spacing between the finger and an adjacent finger.

In some aspects, the techniques described herein relate to a surface acoustic wave device including: a piezoelectric layer; a first interdigital transducer electrode and a second interdigital transducer electrode in electrical communication with the piezoelectric layer; a reflector positioned between the first and second interdigital transducer electrodes such that the first interdigital transducer electrode, the second interdigital transducer electrode, and the reflector are aligned along a longitudinal direction; and a temperature compensation layer over the first interdigital transducer electrode, the second interdigital transducer electrode, and the reflector, the temperature compensation layer having a first region with a first thickness overlapping at least the first interdigital transducer electrode and a first portion of the reflector, a second region with a second thickness overlapping at least the second interdigital transducer electrode and a second portion of the reflector, and a sidewall between the first region and the second region, the first thickness being greater than the second thickness, the sidewall having a wave scattering surface.

In some embodiments, the techniques described herein relate to a surface acoustic wave device wherein the wave scattering surface has a plurality of angled sections that are angled relative to a respective adjacent section.

In some embodiments, the techniques described herein relate to a surface acoustic wave device wherein a difference between the first thickness and the second thickness is in a range between 100 nm and 500 nm.

In some embodiments, the techniques described herein relate to a surface acoustic wave device wherein a difference between the first thickness and the second thickness is in a range between 100 nm and 300 nm.

In some embodiments, the techniques described herein relate to a surface acoustic wave device wherein the sidewall is sloped from the first region to the second region.

In some embodiments, the techniques described herein relate to a surface acoustic wave device further including a third interdigital transducer electrode coupled longitudinally with the first and second interdigital transducer electrodes, and a second reflector between the second interdigital transducer electrode and the third interdigital transducer electrode.

In some embodiments, the techniques described herein relate to a surface acoustic wave device wherein the temperature compensation layer further includes a third region having a third thickness that overlaps at least the third interdigital transducer electrode and a portion of the second reflector, and a second sidewall between the second region and the third region, the third thickness is different from the second thickness.

In some embodiments, the techniques described herein relate to a surface acoustic wave device wherein at least a portion of the second sidewall extending non-perpendicular to the longitudinal direction.

In some embodiments, the techniques described herein relate to a surface acoustic wave device wherein the sidewall extends in a direction that is angled in a range between 1° and 15° from a transverse direction perpendicular to the longitudinal direction.

In some embodiments, the techniques described herein relate to a surface acoustic wave device wherein the first and second interdigital transducer electrodes have different lateral sizes.

In some embodiments, the techniques described herein relate to a surface acoustic wave device wherein the temperature compensation layer includes silicon oxide.

In some embodiments, the techniques described herein relate to a surface acoustic wave device wherein the first interdigital transducer electrode and the second interdigital transducer electrode have different finger pitches.

In some embodiments, the techniques described herein relate to a surface acoustic wave device wherein the first interdigital transducer electrode is formed on the piezoelectric layer.

In some embodiments, the techniques described herein relate to a surface acoustic wave device wherein the first interdigital transducer electrode is at least partially disposed within the piezoelectric layer.

In some aspects, the techniques described herein relate to a radio frequency module including: a surface acoustic wave device including a piezoelectric layer; a first interdigital transducer electrode and a second interdigital transducer electrode in electrical communication with the piezoelectric layer; a reflector positioned between the first and second interdigital transducer electrodes such that the first interdigital transducer electrode, the second interdigital transducer electrode, and the reflector are aligned along a longitudinal direction; and a temperature compensation layer over the first interdigital transducer electrode, the second interdigital transducer electrode, and the reflector, the temperature compensation layer having a first region with a first thickness overlapping at least the first interdigital transducer electrode and a first portion of the reflector, a second region with a second thickness overlapping at least the second interdigital transducer electrode and a second portion of the reflector, and a sidewall between the first region and the second region, the first thickness being greater than the second thickness, the sidewall having a wave scattering surface; and an antenna couple to the surface acoustic wave device.

In some embodiments, the techniques described herein relate to a radio frequency module wherein the wave scattering surface has a plurality of angled sections that are angled relative to a respective adjacent section.

In some embodiments, the techniques described herein relate to a radio frequency module wherein a difference between the first thickness and the second thickness is in a range between 100 nm and 500 nm.

In some embodiments, the techniques described herein relate to a radio frequency module wherein the temperature compensation layer includes silicon oxide.

In some embodiments, the techniques described herein relate to a radio frequency module wherein the first interdigital transducer electrode and the second interdigital transducer electrode have different finger pitches.

In some embodiments, the techniques described herein relate to a radio frequency module further including a power amplifier and a radio frequency switch coupled to the surface acoustic wave device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figures 1A, 1B:
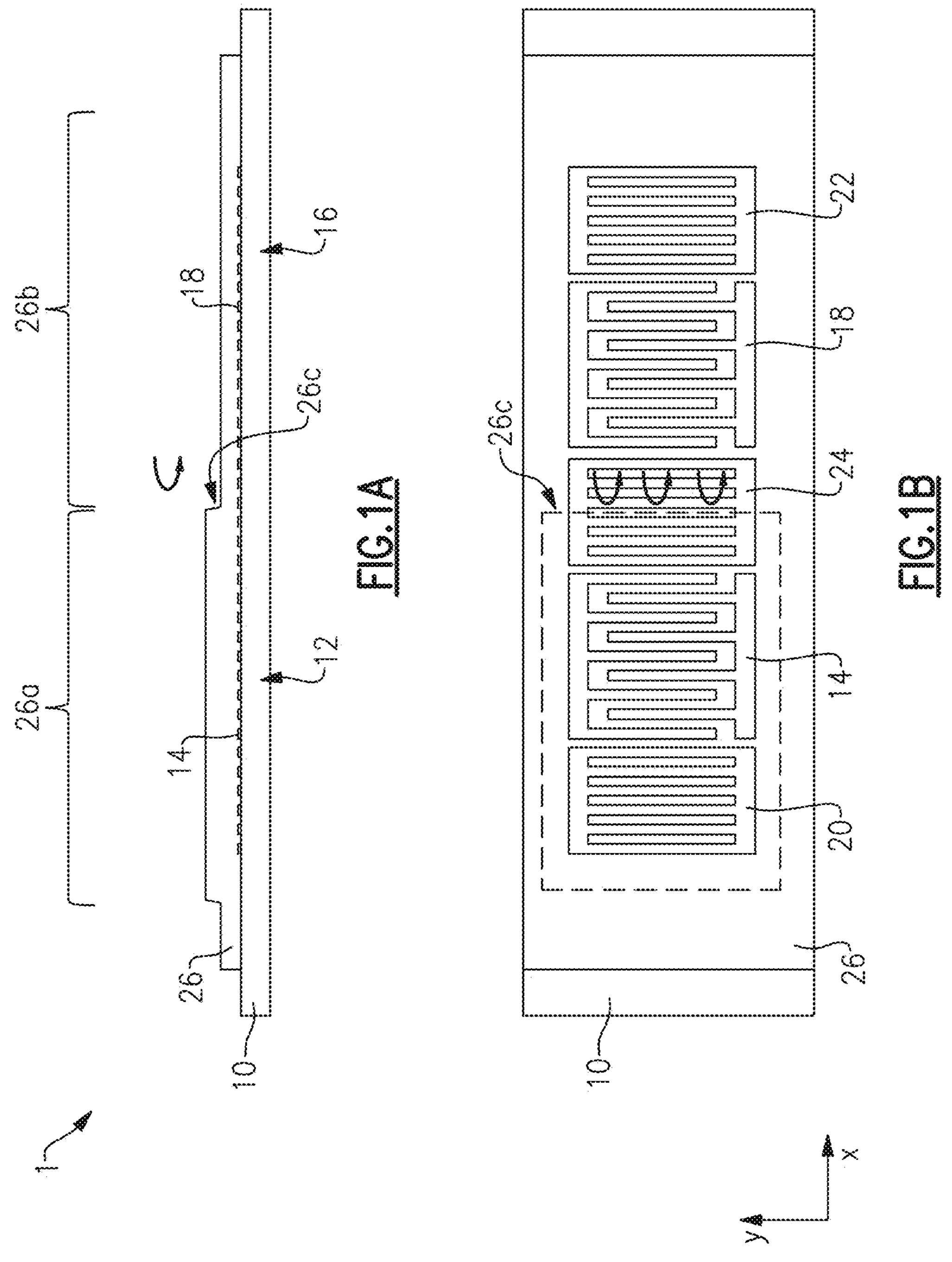
FIG. 1A is a schematic cross-sectional side view of a surface acoustic wave (SAW) device.
FIG. 1B is a schematic top plan view of the SAW device of FIG. 1A.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. The surface acoustic wave devices include, for example, SAW resonators, SAW delay lines, and multi-mode SAW (MMS) filters (e.g., double mode SAW (DMS) filters).

In general, high quality factor (Q), large effective electromechanical coupling coefficient or coupling factor ($K^2$), high frequency ability, and spurious free can be significant aspects for micro resonators to enable low-loss filters, stable oscillators, and sensitive sensors. In some SAW devices, performance can be degraded when a magnitude of a temperature coefficient of frequency (TCF) is large. Therefore, a temperature compensation layer can be provided to bring the TCF of the SAW device closer to zero. A thickness of the temperature compensation layer can affect the TCF, the coupling coefficient $K^2$, and spurious of the resonator under which the temperature compensation layer is disposed.

In order to minimize the lateral dimension of a SAW device, a reflector can be shared by multiple resonators (e.g., a first resonator and a second resonator). The multiple resonators may be provided for different purposes and have different properties and characteristics. For example, the first resonator and the second resonator can operate at a different frequency. Accordingly, in a TC-SAW device that includes a shared resonator, it may be beneficial to have a temperature compensation layer that has different regions (e.g., a first region and a second region) with different thicknesses (e.g., a first thickness and a second thickness) to provide, for example, optimal TCF, $K^2$, and/or spurious of the resonators under which the temperature compensation layer is disposed. However, the performance of the TC-SAW device can be degraded due to the thickness discontinuity at an intersection between the first region and the second region. For example, a spike in a frequency response can be caused.

Various embodiments disclosed herein relate to acoustic wave devices (e.g., temperature compensated surface acoustic wave (TC-SAW) devices) with a shared reflector that include a temperature compensation layer that includes different regions (e.g., a first region and a second region) with different thicknesses (e.g., a first thickness and a second thickness). The first region overlaps at least a first resonator and a first portion of a reflector, the second region overlaps at least the second interdigital transducer electrode and a second portion of the reflector, and a sidewall between the first region and the second region. In some embodiments, the sidewall laterally extends non-perpendicular to a longitudinal direction or a wave propagation direction of a wave generated by the second interdigital transducer electrode. In some embodiments, the sidewall has a wave scattering surface that can scatter an incident wave generated by the second interdigital transducer electrode.

FIG. 1A is a schematic cross-sectional side view of a surface acoustic wave (SAW) device 1. FIG. 1B is a schematic top plan view of the SAW device 1. The SAW device 1 includes a piezoelectric layer 10, a first resonator 12 that includes a first interdigital transducer (IDT) electrode 14 formed over the piezoelectric layer 10, a second resonator 16 that includes a second IDT electrode 18 formed over the piezoelectric layer 10, a first reflector 20, a second reflector 22, a shared reflector 24, and a temperature compensation layer 26. The first IDT electrode 14 is positioned between the first reflector 20 and the shared reflector 24, and the second IDT electrode 16 is positioned between the second reflector 22 and the shared reflector 24. The first and second IDT electrodes 14, 18, the first and second reflectors 20, 22, and the shared reflector 24 are aligned in a longitudinal direction (e.g., along the x-axis shown in FIG. 1B).

The temperature compensation layer 26 includes a first region 26*a* over the first resonator 12, the first reflector 20, and a portion of the shared reflector 24, a second region 26*b* over the second resonator 16, the second reflector 22, and a portion of the shared reflector 24, and a sidewall 26*c* at an intersection between the first and second regions 26*a*, 26*b*. The sidewall extends horizontally (e.g., the x-y plane) along a transverse direction (e.g., along the y-axis shown in FIG. 1B) non-parallel (e.g., perpendicular) to the longitudinal direction. The first region 26*a* has a first thickness and the second region 26*b* has a second thickness, in which the first thickness is greater than the second thickness.

A wave generated by the second resonator 16 that includes the second IDT electrode 18 propagates in the longitudinal direction. The second reflector 22 and the shared reflector 24 can reflect the wave thereby creating a standing wave pattern. However, the sidewall 26*c* can reflect the wave in a manner that would create unwanted peaks or distortions in the frequency response. Therefore, the thickness or height difference between the first region 26*a* and the second region 26*b* may degrade the performance of the SAW device 1. The performance degradation of the SAW device 1 can be significant especially when the thickness difference between the first region 26*a* and the second region 26*b* is greater than about 50 nm, greater than about 100 nm, or greater than about 200 nm.

Figures 2A, 2B:
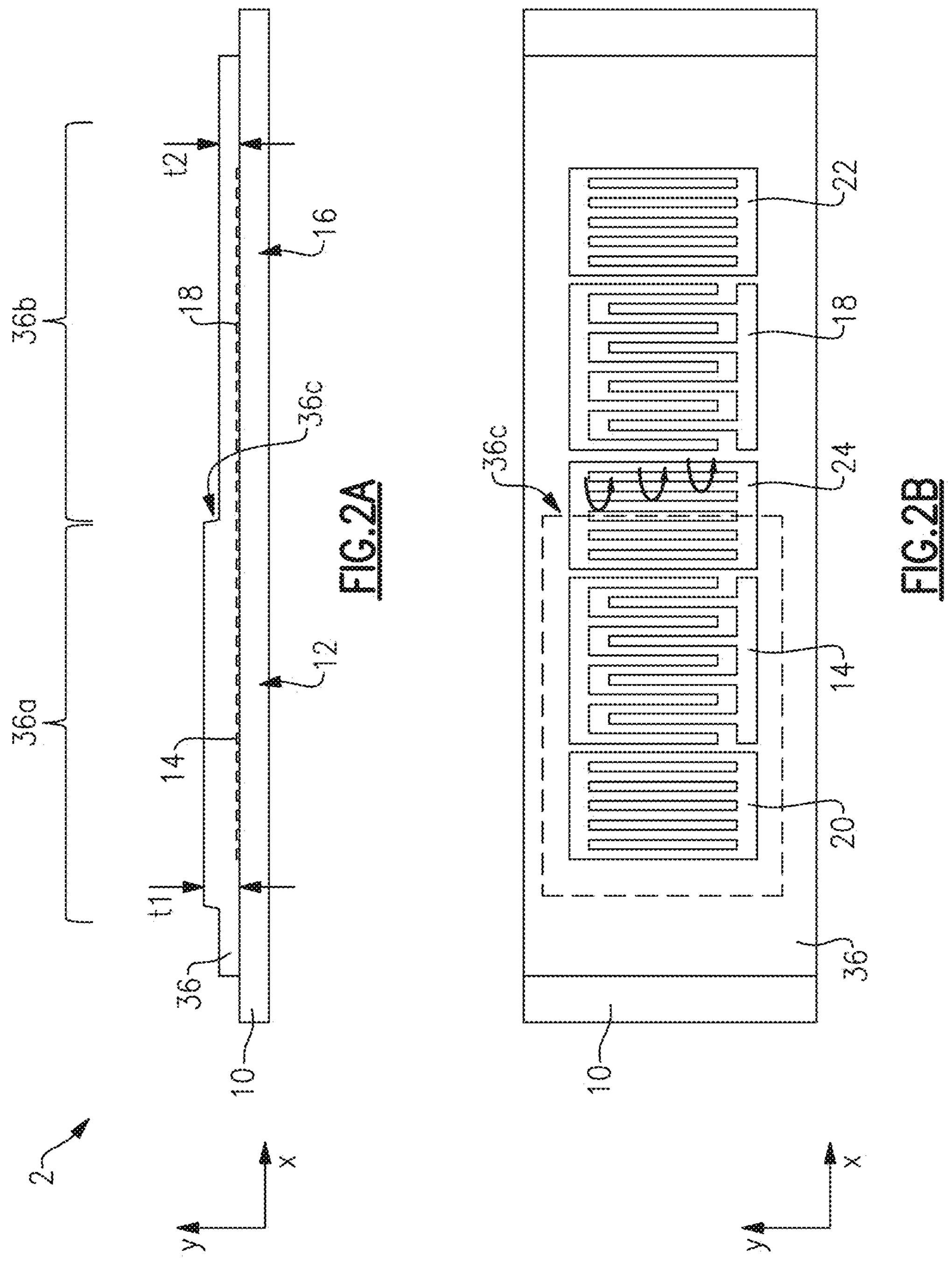
FIG. 2A is a schematic cross-sectional side view of a surface acoustic wave (SAW) device according to an embodiment.
FIG. 2B is a schematic top plan view of the SAW device of FIG. 2A.

FIG. 2A is a schematic cross-sectional side view of a surface acoustic wave (SAW) device 2 according to an embodiment. FIG. 2B is a schematic top plan view of the SAW device 2. The SAW device 2 can include a piezoelectric layer 10, a first resonator 12 that includes a first interdigital transducer (IDT) electrode 14 in electrical communication with the piezoelectric layer 10, a second resonator 16 that includes a second IDT electrode 18 in electrical communication with the piezoelectric layer 10, a first reflector 20, a second reflector 22, a shared reflector 24, and a temperature compensation layer 36. In some embodiments, the first interdigital transducer (IDT) electrode 14 formed with (e.g., formed over, on, in, or at least partially within) the piezoelectric layer 10 and the second IDT electrode 18 formed with (e.g., formed over, on, in, or at least partially within) the piezoelectric layer 10. The first IDT electrode 14 is positioned between the first reflector 20 and the shared reflector 24, and the second IDT electrode 16 is positioned between the second reflector 22 and the shared reflector 24. The first and second IDT electrodes 14, 18, the first and second reflectors 20, 22, and the shared reflector 24 are aligned in a longitudinal direction (e.g., along the x-axis shown in FIG. 2B). In some embodiments, one of the first and second resonators 12, 16 can be a series resonator in a filter and the other one of the first and second resonators 12, 16 can be a shunt resonator in the filter.

The piezoelectric layer 10 can be a lithium niobate (LN). For example, the piezoelectric layer 10 can be an LN layer having a cut angle of about 118° (118° Y-cut X-propagation LN) or more or a cut angle of about 132° (132Y-cut X-propagation LN) or less. For example, the piezoelectric layer 10 can be 125±20° Y-cut LN, 125±15° Y-cut LN, 125±10° Y-cut LN, or 125±5° Y-cut LN. Any other suitable piezoelectric material, such as a lithium tantalate (LT) layer, can be used as the piezoelectric layer 10. For example, the piezoelectric layer 10 can be an LT layer having a cut angle of 42° (42° Y-cut X-propagation LT) or a cut angle of 60° (60° Y-cut X-propagation LT). For example, the piezoelectric layer 10 can be 42±20° Y-cut LT, 42±15° Y-cut LT, 42±10° Y-cut LT, 42±5° Y-cut LT, 60±20° Y-cut LT, 60±15° Y-cut LT, 60±10° Y-cut LT, or 60±5° Y-cut LT. A thickness of the piezoelectric layer 10 can be selected based on a wavelength λ or L of a surface acoustic wave generated by the SAW device 1 in certain applications. The first and second IDT electrodes 14, 18 can have pitches that set the wavelengths λ or L of the resonators 12, 16. The pitches of the first and second IDT electrodes 14, 18 can be the same or different. The piezoelectric layer 10 can be sufficiently thick to avoid significant frequency variation.

The first IDT electrode 14 can include any suitable material. The first IDT electrode 14 may include one or more metals, such as aluminum (Al), copper (Cu), Magnesium (Mg), titanium (Ti), tungsten (W), molybdenum (Mo), etc. The first IDT electrode 14 may include alloys, such as AlMgCu, AlCu, etc. In some embodiments, the first IDT electrode 14 can have a multi-layer IDT electrode that includes more than two layers. For example, the first IDT electrode 14 can include first and second layers (not shown). The first layer can include tungsten (W) and the second layer can include aluminum (Al) in certain embodiments.

The second IDT electrode 18 can include any suitable material. The second IDT electrode 18 may include one or more metals, such as aluminum (Al), copper (Cu), Magnesium (Mg), titanium (Ti), tungsten (W), molybdenum (Mo), etc. The second IDT electrode 18 may include alloys, such as AlMgCu, AlCu, etc. In some embodiments, the second IDT electrode 18 can have a multi-layer IDT electrode that includes more than two layers. For example, the second IDT electrode 18 can include first and second layers (not shown). The first layer can include tungsten (W) and the second layer can include aluminum (Al) in certain embodiments.

The first and second reflectors 20, 22 and the shared reflector 24 can include any suitable material. The first and second reflectors 20, 22 and the shared reflector 24 may include one or more metals, such as aluminum (Al), copper (Cu), Magnesium (Mg), titanium (Ti), tungsten (W), molybdenum (Mo), etc. The first and second reflectors 20, 22 and the shared reflector 24 may include alloys, such as AlMgCu, AlCu, etc. In some embodiments, the first and second reflectors 20, 22 and the shared reflector 24 can have a multi-layer IDT electrode that includes more than two layers. For example, the first and second reflectors 20, 22 and the shared reflector 24 can include first and second layers (not shown). The first layer can include tungsten (W) and the second layer can include aluminum (Al) in certain embodiments.

Spacings (e.g., pitches) between fingers of the first and second IDT electrodes 14, 18, the first and second reflectors 20, 22, and the shared reflector 24 can be the same in some embodiments. In some other embodiments, the pitches can be different. In some embodiments, the pitches can be modulated. For example, the shared reflector 24 can have a first pitch closer to the first IDT electrode 14 and a second pitch closer to the second IDT electrode 18.

The temperature compensation layer 36 can include any suitable temperature compensation material. For example, the temperature compensation layer 36 can be a silicon dioxide ($SiO_2$) layer. The temperature compensation layer 36 can be a layer of any other suitable material having a positive temperature coefficient of frequency for SAW resonators with a piezoelectric layer 10 having a negative coefficient of frequency. For instance, the temperature compensation layer 36 can be a tellurium dioxide ($TeO_2$) layer or a silicon oxyfluoride (SiOF) layer in certain applications. The temperature compensation layer 36 can include any suitable combination of $SiO_2$, $TeO_2$, and/or SiOF.

The temperature compensation layer 36 can bring the temperature coefficient of frequency (TCF) of the SAW resonator 2 closer to zero relative to a similar SAW resonator without the temperature compensation layer 36. The temperature compensation layer 36 together with a lithium niobate (LN) piezoelectric layer can improve the electromechanical coupling coefficient ($k^2$) of the SAW resonator 2 relative to a similar SAW resonator with a lithium tantalate piezoelectric layer and without the temperature compensation layer 36. This advantage of the temperature compensation layer 36 can be more pronounced when the SAW resonator 2 includes an LN layer as the piezoelectric layer 10.

The temperature compensation layer 36 includes a first region **36*a* over the first resonator 12, the first reflector 20, and a portion of the shared reflector 24, a second region 36*b* over the second resonator 16, the second reflector 22, and a portion of the shared reflector 24, and a sidewall 36*c* at an intersection between the first and second regions 36*a*, 36*b*. The sidewall 36*c* at least partially overlaps the shared reflector 24**.

A thickness of the temperature compensation layer 36 can affect the TCF, the coupling coefficient $K^2$, and spurious of the resonator under which the temperature compensation layer is disposed. Therefore, the thicknesses of the first region **36*a* and the second region 36*b* can be determined based at least in part on the TCF, the coupling coefficient $K^2$, and spurious of the first and second resonators 12, 16, and be different in some applications. For example, the first region 36*a* has a first thickness t1 and the second region 36*b* has a second thickness t2, in which the first thickness t1 is greater than the second thickness t2. In some embodiments, the difference between the first thickness t1 and the second thickness t2 can be greater than about 50 nm, 100 nm, or 200 nm. For example, the difference between the first thickness t1 and the second thickness t2** can be in a range between 1 nm and 500 nm, 10 nm and 500 nm, 50 nm and 500 nm, 100 nm and 500 nm, 200 nm and 500 nm, 100 nm and 400 nm, or 100 nm and 300 nm.

The difference between the first and second thicknesses t1, t2 can define a height of the sidewall **36*c*. Unlike the sidewall 26*c* of the SAW device 1 shown in FIGS. 1A and 1B, the sidewall 36*c* of the SAW device 2 does not extend horizontally along a transverse direction (e.g., along the y-axis shown in FIG. 2B) perpendicular to the longitudinal direction (e.g., the wave propagation direction). Rather, the sidewall 36*c* is angled relative to the transverse direction. The sidewall 36*c* can be angled so as to control reflection timing of the wave generated by the second IDT electrode 18** and/or to reflect the wave to a non-longitudinal direction.

In some embodiments, the sidewall **36*c* can extend horizontally or laterally (e.g., the x-y plane) in a direction that is angled in a range between 1° and 45°, 3° and 30°, 5° and 30°, 5° and 20°, or 1° and 15° relative to the transverse direction (e.g., the y-axis). In some embodiments, the sidewall 36*c* can be angled such that sidewall 36*c* crosses at least one finger of the shared reflector 24. For example, the sidewall 36*c* can be angled such that sidewall 36*c* crosses one finger of the shared reflector 24, one finger and a spacing between adjacent fingers of the shared reflector 24, or two or more fingers of the shared reflector 24**.

In the illustrated example of FIGS. 2A and 2B, the wave generated by the second IDT electrode 18 reaches a location of the sidewall **36*c* closest from the second IDT electrode 18 first, and gradually reaches a location of the sidewall 36*c* farthest from the second IDT electrode 18. Therefore, the reflection timing at different locations along the sidewall 36*c* can be different (e.g., delayed). The inventors discovered that making the reflection timing at different locations along the sidewall 36*c* different can mitigate the impact of the reflection due to the thickness difference (e.g., the height of the sidewall 36*c*) between the first region 36*a* and the second region 36*b*. Also, because the sidewall 36*c* is angled relative to the transverse direction (e.g., the y-axis), the reflected wave may not reflect straight back to the second IDT electrode 18, thereby mitigating the impact of the reflection due to the thickness difference as compared to the sidewall 26***c* of the SAW device 1.

In some embodiments, the sidewall 36*c* can be tapered or sloped from the first region 36*a* to the second region 36*b* relative to a vertical direction (e.g., the z-axis). For example, the sidewall 36*c* can be tapered relative to the vertical direction with a tapered angle in a range between 1° and 45°, 10° and 45°, or 10° and 30°. The taper of the sidewall 36*c* can be an artifact of an etching process. The tapered angle of the sidewall 36*c* can be intentionally selected in some embodiments.

Figure 3:
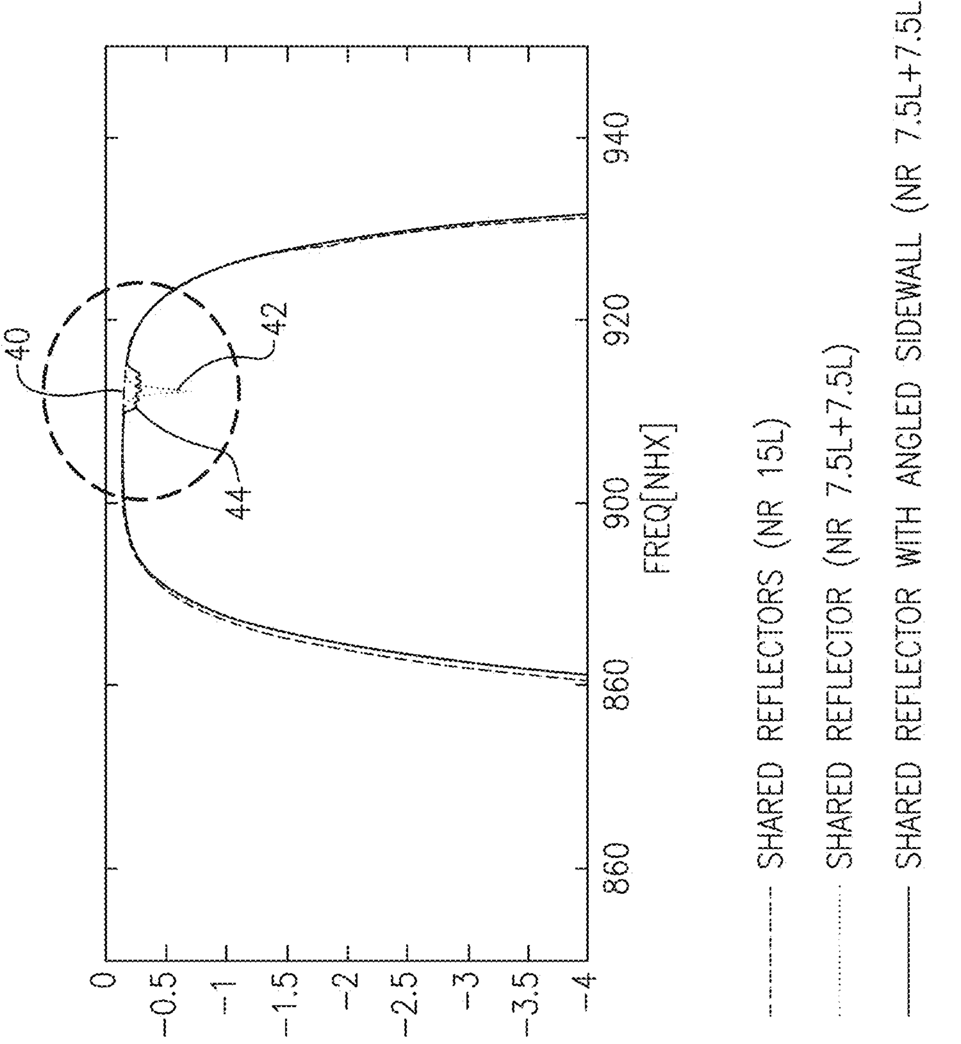
FIG. 3 is a graph showing simulation results of frequency responses of three different surface acoustic wave devices.

FIG. 3 is a graph showing simulation results of frequency responses of three different surface acoustic wave devices. The frequency response 40 is of a SAW device that includes two resonators each having a pair of reflectors, the frequency response 42 is of the SAW device 1 of FIGS. 1A and 1B, and the frequency response 44 is of the SAW device 2 of FIGS. 2A and 2B. The frequency response 42 has a peak in the circled area at around 915 MHz that degrades the performance as compared to the frequency response 40. The degradation can be due to the thickness difference between the first region 26*a* and the second region 26*b* of the SAW device 1. The simulation results indicate that the peak or the degradation is mitigated in the frequency response 44 is of the SAW device 2.

The sidewall 36*c* of the SAW device 2 shown in FIGS. 2A and 2B is an example of a structure that can mitigate the formation of the peak or the degradation of the resonator performance. Any other shapes and/or characteristics of a sidewall that can alter (e.g., delay) reflection timing of an incident wave at different locations of the sidewall, alter reflection angle, and/or scatter the incident wave can be used as a degradation mitigation structure.

Figures 4A, 4B:
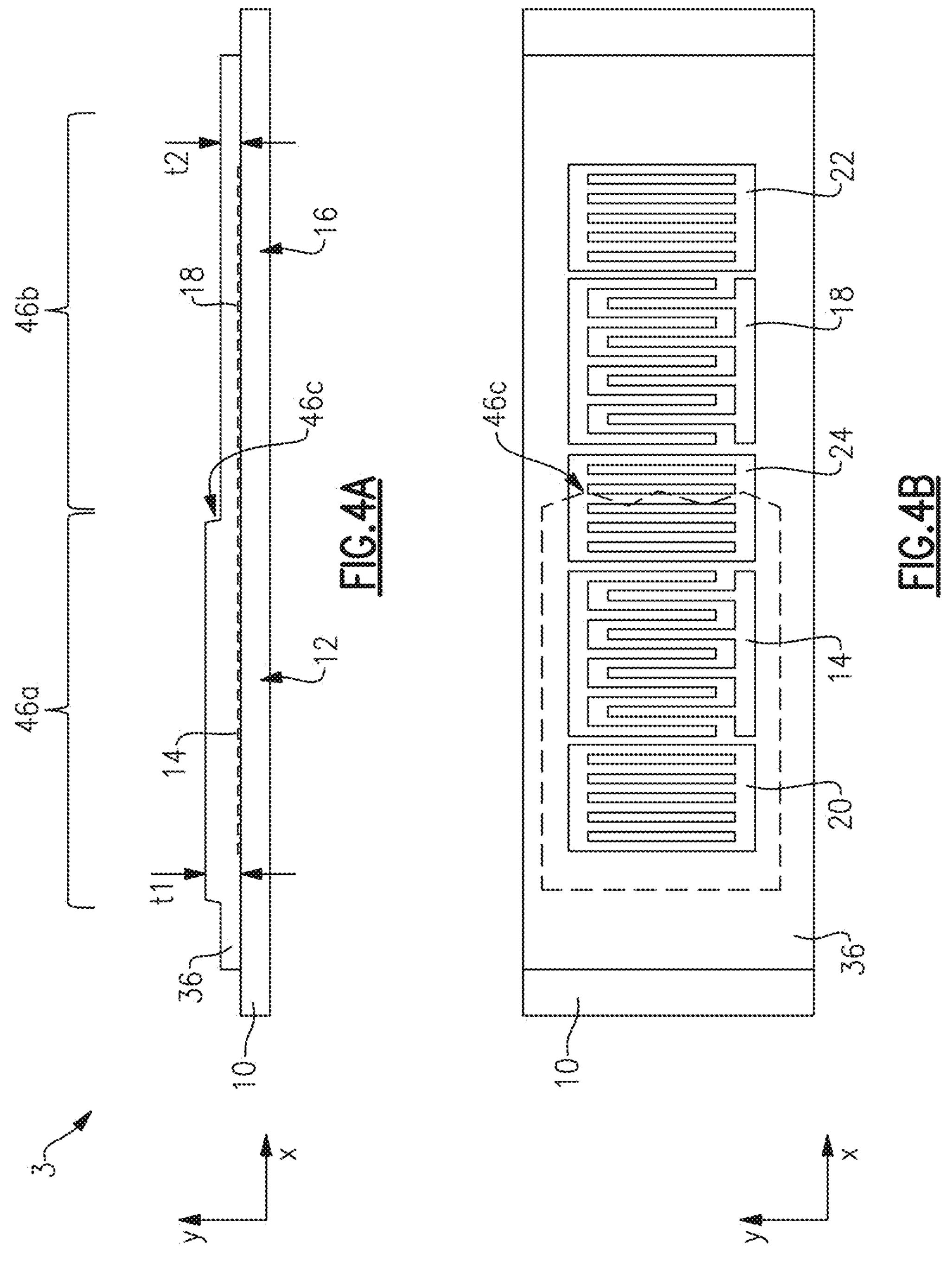
FIG. 4A is a schematic cross-sectional side view of a surface acoustic wave (SAW) device according to another embodiment.
FIG. 4B is a schematic top plan view of the SAW device of FIG. 4A.

FIG. 4A is a schematic cross-sectional side view of a surface acoustic wave (SAW) device 3 according to an embodiment. FIG. 4B is a schematic top plan view of the SAW device 3. The SAW device 3 can include a piezoelectric layer 10, a first resonator 12 that includes a first interdigital transducer (IDT) electrode 14 formed with (e.g., formed over, on, in, or at least partially within) the piezoelectric layer 10, a second resonator 16 that includes a second IDT electrode 18 formed with (e.g., formed over, on, in, or at least partially within) the piezoelectric layer 10, a first reflector 20, a second reflector 22, a shared reflector 24, and a temperature compensation layer 46. The first IDT electrode 14 is positioned between the first reflector 20 and the shared reflector 24, and the second IDT electrode 16 is positioned between the second reflector 22 and the shared reflector 24. The first and second IDT electrodes 14, 18, the first and second reflectors 20, 22, and the shared reflector 24 are aligned in a longitudinal direction (e.g., along the x-axis shown in FIG. 4B). In some embodiments, one of the first and second resonators 12, 16 can be a series resonator in a filter and the other one of the first and second resonators 12, 16 can be a shunt resonator in the filter. Unless otherwise noted, the components of the SAW device 3 shown in FIGS. 4A and 4B may be structurally and/or functionally the same as or generally similar to like components disclosed herein, such as of the SAW device 2 of FIGS. 2A and 2B.

The temperature compensation layer 46 includes a first region 46*a* over the first resonator 12, the first reflector 20, and a portion of the shared reflector 24, a second region 46*b* over the second resonator 16, the second reflector 22, and a portion of the shared reflector 24, and a sidewall 46*c* at an intersection between the first and second regions 46*a*, 46*b*. The sidewall 46*c* at least partially overlaps the shared reflector 24.

Unlike the sidewall 36*c* of the temperature compensation layer 36, the sidewall 46*c* of the temperature compensation layer 46 includes a zig zag shape having a plurality of angled sections that are angled relative to the adjacent section(s). Each section can be angled relative to a transverse direction (e.g., along the y-axis shown in FIG. 4B) perpendicular to the longitudinal direction (e.g., the wave propagation direction). The sidewall 46*c* can alter (e.g., delay) reflection timing of an incident wave at different locations of the sidewall 46*c*, alter reflection angle, and/or scatter the incident wave, thereby mitigating the degradation that can be present with the sidewall 26*c* of the SAW device 1. A surface of a sidewall that scatters the incident wave, such as the sidewall 46*c*, can be referred to as a wave scattering surface.

The structures of the sidewalls 36*c*, 46*c* are examples of degradation mitigation structures that can mitigate the formation of the peak shown in the frequency response 42 of FIG. 3. Any other suitable structures (e.g., shapes and characteristics), such as a rounded shape or a roughened surface that scatters an incident wave, at an intersection between different regions having different thicknesses can function as the degradation mitigation structures.

The SAW device 2 shown in FIGS. 2A and 2B and the SAW device 3 shown in FIGS. 4A and 4B are temperature compensated surface acoustic wave (TC-SAW) devices. However, the principles and advantages disclosed herein may be implemented in other SAW devices, such as, a temperature compensated multilayer piezoelectric substrate (TC-MPS) SAW device.

Figures 5A, 5B:
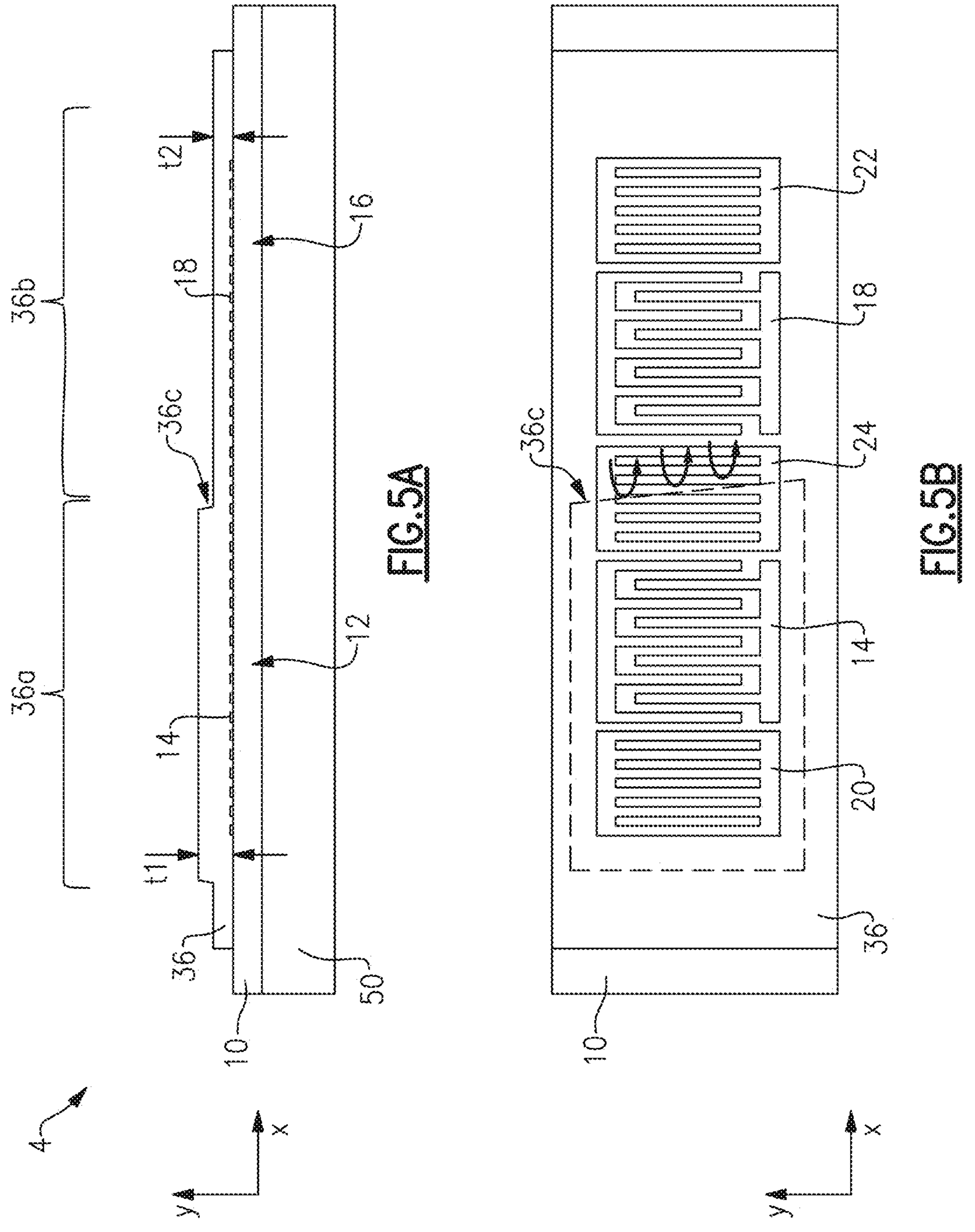
FIG. 5A is a schematic cross-sectional side view of a surface acoustic wave (SAW) device according to another embodiment.
FIG. 5B is a schematic top plan view of the SAW device of FIG. 5A.

FIG. 5A is a schematic cross-sectional side view of a surface acoustic wave (SAW) device 4 according to an embodiment. FIG. 5B is a schematic top plan view of the SAW device 4. The SAW device 4 is an example of a temperature compensated multilayer piezoelectric substrate (TC-MPS) SAW device. The SAW device 4 can include a support substrate 50, a piezoelectric layer 10 over the support substrate 50, a first resonator 12 that includes a first interdigital transducer (IDT) electrode 14 formed with (e.g., formed over, on, in, or at least partially within) the piezoelectric layer 10, a second resonator 16 that includes a second IDT electrode 18 formed with (e.g., formed over, on, in, or at least partially within) the piezoelectric layer 10, a first reflector 20, a second reflector 22, a shared reflector 24, and a temperature compensation layer 36. The first IDT electrode 14 is positioned between the first reflector 20 and the shared reflector 24, and the second IDT electrode 16 is positioned between the second reflector 22 and the shared reflector 24. The first and second IDT electrodes 14, 18, the first and second reflectors 20, 22, and the shared reflector 24 are aligned in a longitudinal direction (e.g., along the x-axis shown in FIG. 5B). In some embodiments, one of the first and second resonators 12, 16 can be a series resonator in a filter and the other one of the first and second resonators 12, 16 can be a shunt resonator in the filter. Unless otherwise noted, the components of the SAW device 4 shown in FIGS. 5A and 5B may be structurally and/or functionally the same as or generally similar to like components disclosed herein, such as of the SAW device 2 of FIGS. 2A and 2B.

The support substrate 50 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. The support substrate 50 can have a relatively high acoustic impedance. An acoustic impedance of the support substrate 50 can be higher than an acoustic impedance of the piezoelectric layer 10. For instance, the support substrate 50 can have a higher acoustic impedance than an acoustic impedance of lithium niobate and a higher acoustic impedance than lithium tantalate. The acoustic impedance of the support substrate 50 can be higher than an acoustic impedance of silicon dioxide ($SiO_2$). The SAW resonator 4 including the piezoelectric layer 10 on a support substrate 50 with relatively high thermal conductivity, such as silicon substrate, can achieve better thermal dissipation compared to a similar SAW resonator without the high impedance support substrate 50.

FIGS. 2A, 2B, and 4A-5B illustrate two resonators coupled longitudinally with a shared reflector therebetween. However, the principles and advantages disclosed herein may be implemented with three or more resonators coupled longitudinally with shared reflectors therebetween. Also, two or more different degradation mitigation structures can be implemented in a SAW device. For example, the sidewalls 36*c*, 46*c* can be implemented in one SAW device (see FIGS. 6A and 6B).

Figures 6A, 6B:
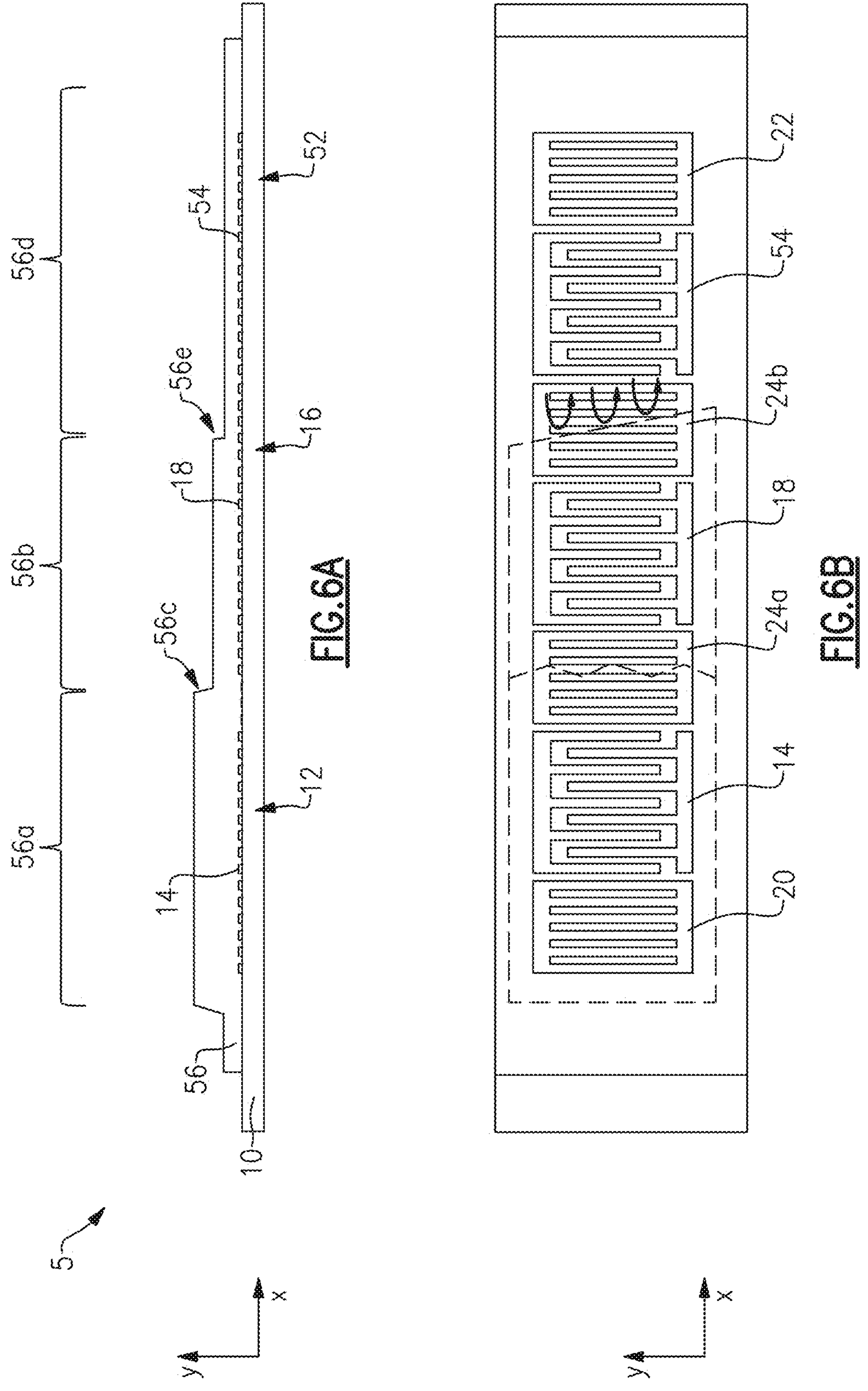
FIG. 6A is a schematic cross-sectional side view of a surface acoustic wave (SAW) device according to another embodiment.
FIG. 6B is a schematic top plan view of the SAW device of FIG. 6A.

FIG. 6A is a schematic cross-sectional side view of a surface acoustic wave (SAW) device 5. FIG. 6B is a schematic top plan view of the SAW device 5. The SAW device 5 can include a piezoelectric layer 10, a first resonator 12 that includes a first interdigital transducer (IDT) electrode 14 formed with (e.g., formed over, on, in, or at least partially within) the piezoelectric layer 10, a second resonator 16 that includes a second IDT electrode 18 formed with (e.g., formed over, on, in, or at least partially within) the piezoelectric layer 10, a third resonator 52 that includes a third IDT electrode 54 formed with (e.g., formed over, on, in, or at least partially within) the piezoelectric layer 10, a first reflector 20, a second reflector 22, a first shared reflector 24*a*, a second shared reflector 24*b* and a temperature compensation layer 56. The first IDT electrode 14 is positioned between the first reflector 20 and the first shared reflector 24*a*, the second IDT electrode 16 is positioned between the first and second shared reflectors 24*a*. 24*b*, and the third IDT electrode 54 is positioned between the second shared reflector 24*b* and the second reflector 22. The first to third IDT electrodes 14, 18, 54, the first and second reflectors 20, 22, and the first and second shared reflectors 24*a*, 24*b* are aligned in a longitudinal direction (e.g., along the x-axis shown in FIG. 6B). Unless otherwise noted, the components of the SAW device 5 shown in FIGS. 6A and 6B may be structurally and/or functionally the same as or generally similar to like components of the SAW devices 2, 3, 4 of FIGS. 2A, 2B, and 4A-5B.

The temperature compensation layer 56 includes a first region 56*a* over the first resonator 12, the first reflector 20, and a portion of the first shared reflector 24*a*, a second region 56*b* over the second resonator 16, a portion of the first shared reflector 24*a*, and a portion of the second shared reflector 24*b*, a sidewall 56*c* at an intersection between the first and second regions 56*a*, 56*b*, a third region 56*d* over the third resonator 54, a portion of the second shared reflector 24*b*, and the second reflector 22, and a sidewall 56*e* at an intersection between the second and third regions 56*b*, 56*d*. The sidewall 56*c* at least partially overlaps the first shared reflector 24*a*, and the sidewall 56*e* at least partially overlaps the second shared reflector 24*b*. The sidewall 56*c* can have the same or generally similar structure and function as the sidewall 36*c* disclosed herein and the sidewall 56*e* can have the same or generally similar structure and function as the sidewall 46*c* disclosed herein.

The degradation mitigation structures (e.g., the sidewall 36*c*, 46*c*, 56*c*, 56*e*) can be implemented in any temperature compensated SAW devices that includes two or more resonators coupled longitudinally with an intervening shared reflector. The resonators may not be of the same structure and/or the same size. In some embodiments, one resonator can have a slanted IDT electrode and another resonator that shares a shared reflector with the slanted IDT electrode can have a non-slanted IDT electrode. In some other embodiments, one resonator can be greater in size than another resonator that shares the same reflector (see FIGS. 6C and 6D).

Figures 6C, 6D:
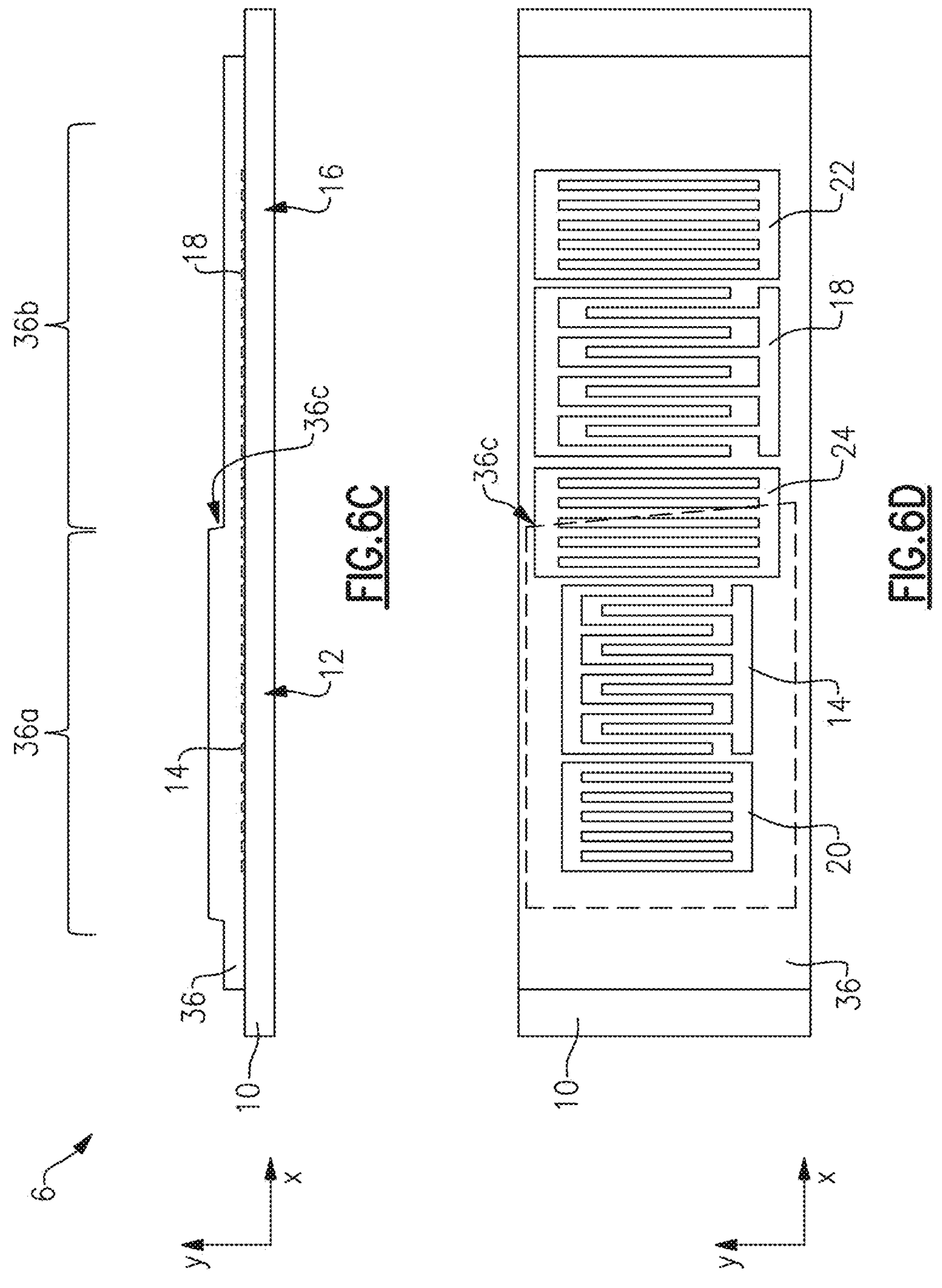
FIG. 6C is a schematic cross-sectional side view of a surface acoustic wave (SAW) device according to another embodiment.
FIG. 6D is a schematic top plan view of the SAW device of FIG. 6C.

FIG. 6C is a schematic cross-sectional side view of a surface acoustic wave (SAW) device 6. FIG. 6D is a schematic top plan view of the SAW device 6. The SAW device 6 can include a piezoelectric layer 10, a first resonator 12 that includes a first interdigital transducer (IDT) electrode 14 formed with (e.g., formed over, on, in, or at least partially within) the piezoelectric layer 10, a second resonator 16 that includes a second IDT electrode 18 formed with (e.g., formed over, on, in, or at least partially within) the piezoelectric layer 10, a first reflector 20, a second reflector 22, a shared reflector 24, and a temperature compensation layer 36. The first IDT electrode 14 is positioned between the first reflector 20 and the shared reflector 24, and the second IDT electrode 16 is positioned between the second reflector 22 and the shared reflector 24. The first and second IDT electrodes 14, 18, the first and second reflectors 20, 22, and the shared reflector 24 are aligned in a longitudinal direction (e.g., along the x-axis shown in FIG. 6D). In some embodiments, one of the first and second resonators 12, 16 can be a series resonator in a filter and the other one of the first and second resonators 12, 16 can be a shunt resonator in the filter.

Unless otherwise noted, the components of the SAW device 6 shown in FIGS. 6C and 6D may be structurally and/or functionally the same as or generally similar to like components of the SAW device 2 of FIGS. 2A and 2B. Unlike the SAW device 2 of FIGS. 2A and 2B, in the SAW device 6, the resonator 16 that includes the IDT electrode 18, the second reflector 22, and the shared reflector 24 have dimensions in the transverse direction (e.g., along the y-axis shown in FIG. 6D) that are greater than the transverse dimensions of the first resonator 12 that includes the first IDT electrode 14, and the first reflector 20.

Any suitable principles and advantages disclosed herein can be implemented in a variety of acoustic devices. For example, any suitable principles and advantages disclosed herein can be applied to multilayer piezoelectric surface acoustic wave devices, Lamb wave resonators, shear horizontal mode acoustic wave device, or any acoustic wave devices that include an interdigital transducer electrode over a piezoelectric layer. In some embodiments, a piston mode structure can be implemented with a surface acoustic wave device that implements any suitable principles and advantages disclosed herein.

Figure 7A:
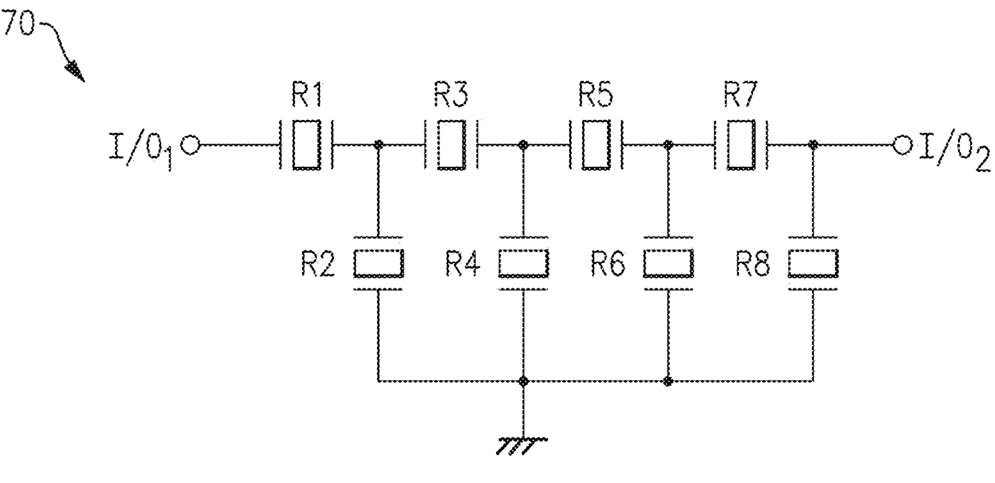
FIG. 7A is a schematic diagram of a ladder filter that includes an acoustic wave resonator according to an embodiment.

FIG. 7A is a schematic diagram of a ladder filter 70 that includes an acoustic wave resonator according to an embodiment. The ladder filter 70 is an example topology that can implement a band pass filter formed from acoustic wave resonators. In a band pass filter with a ladder filter topology, the shunt resonators can have lower resonant frequencies than the series resonators. The ladder filter 70 can be arranged to filter a radio frequency signal. As illustrated, the ladder filter 70 includes series acoustic wave resonators R1, R3, R5, and R7 and shunt acoustic wave resonators R2, R4, R6, and R8 coupled between a first input/output port $I/O_1$ and a second input/output port $I/O_2$. Any suitable number of series acoustic wave resonators can be included in a ladder filter. Any suitable number of shunt acoustic wave resonators can be included in a ladder filter. The first input/output port $I/O_1$ can a transmit port and the second input/output port $I/O_2$ can be an antenna port. Alternatively, first input/output port $I/O_1$ can be a receive port and the second input/output port $I/O_2$ can be an antenna port.

Figures 7B, 7C:
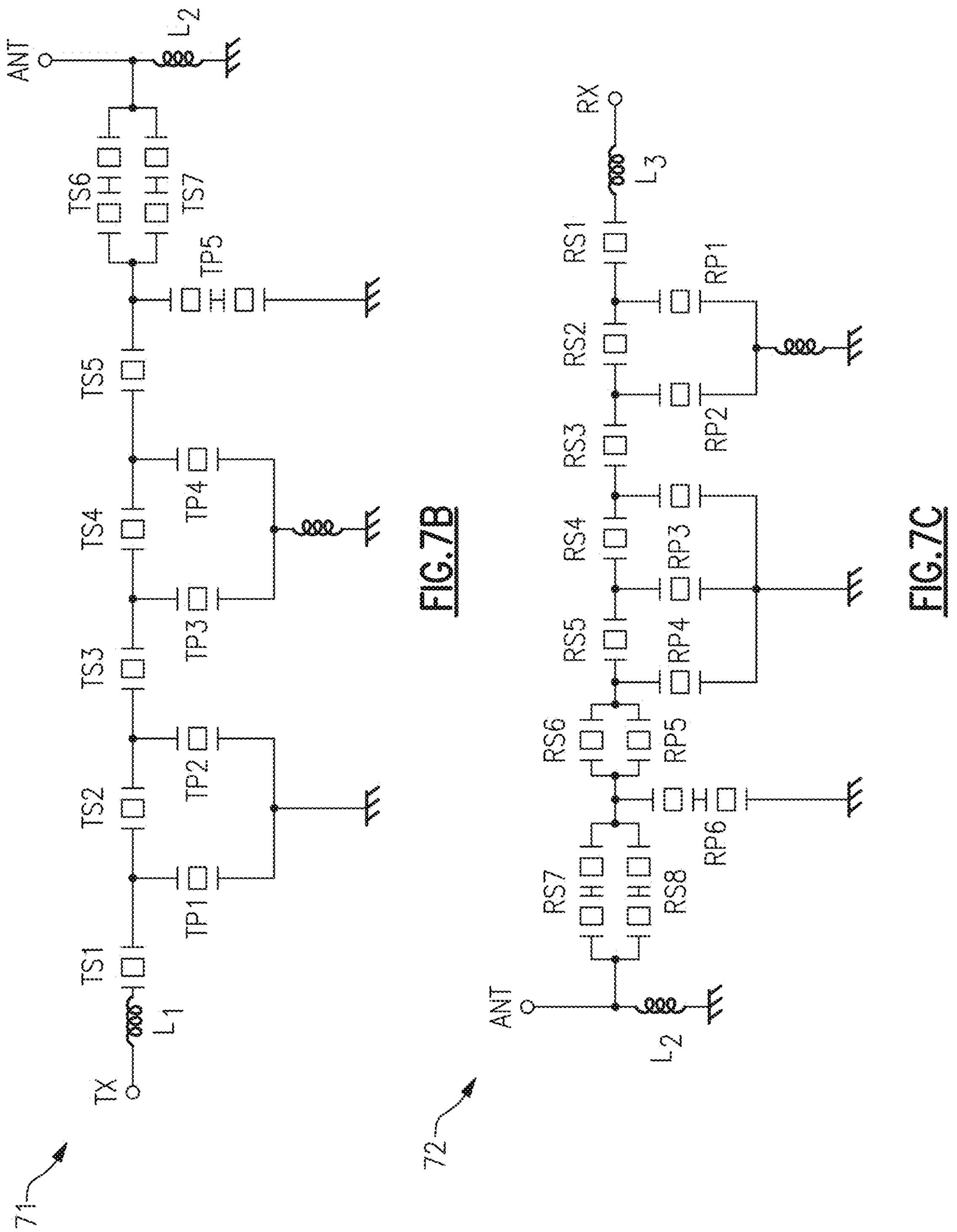
FIG. 7B is a schematic diagram of a transmit filter that includes a surface acoustic wave resonator according to an embodiment.
FIG. 7C is a schematic diagram of a receive filter that includes a surface acoustic wave resonator according to an embodiment.

FIG. 7B is a schematic diagram of an example transmit filter 71 that includes surface acoustic wave resonators of a surface acoustic wave component according to an embodiment. The transmit filter 71 can be a band pass filter. The illustrated transmit filter 71 is arranged to filter a radio frequency signal received at a transmit port TX and provide a filtered output signal to an antenna port ANT. The transmit filter 71 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1, TS2, TS3, TS4, TS5, TS6, and TS7 and/or TP1, TP2, TP3, TP4, and TP5 can be SAW resonators with a conductive strip for transverse mode suppression. For instance, one or more of the SAW resonators of the transmit filter 71 can be any surface acoustic wave resonator disclosed herein. Any suitable number of series SAW resonators and shunt SAW resonators can be included in a transmit filter 71.

FIG. 7C is a schematic diagram of a receive filter 72 that includes surface acoustic wave resonators of a surface acoustic wave component according to an embodiment. The receive filter 72 can be a band pass filter. The illustrated receive filter 72 is arranged to filter a radio frequency signal received at an antenna port ANT and provide a filtered output signal to a receive port RX. The receive filter 72 includes series SAW resonators RS1, RS2, RS3, RS4, RS5, RS6, RS7, and RS7, shunt SAW resonators RP1, RP2, RP3, RP4, and RP5, and RP6, shunt inductor L2, and series output inductor L3. Some or all of the SAW resonators RS1, RS2, RS3, RS4, RS5, RS6, RS7, and RS8 and/or RP1, RP2, RP3, RP4, RP5, and RP6 can be SAW resonators with a conductive strip for transverse mode suppression. For instance, one or more of the SAW resonators of the receive filter 72 can be any surface acoustic wave resonator disclosed herein. Any suitable number of series SAW resonators and shunt SAW resonators can be included in a receive filter 72.

Figure 8:
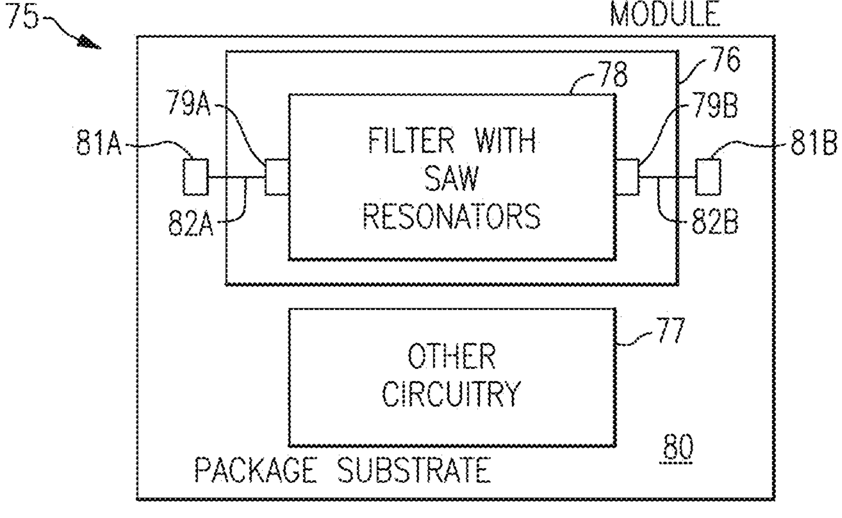
FIG. 8 is a schematic diagram of a radio frequency module that includes a surface acoustic wave component according to an embodiment.

FIG. 8 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators and/or acoustic wave devices disclosed herein. The SAW component 76 can include a SAW die that includes SAW resonators.

The SAW component 76 shown in FIG. 8 includes a filter 78 and terminals 79A and 79B. The filter 78 includes SAW resonators. One or more of the SAW resonators can be implemented in accordance with any suitable principles and advantages of any surface acoustic wave resonator disclosed herein. The filter 78 can be a TC-SAW filter arranged as a band pass filter to filter radio frequency signals with frequencies below about 3.5 GHz in certain applications. The terminals 79A and 78B can serve, for example, as an input contact and an output contact. The SAW component 76 and the other circuitry 77 are on a common packaging substrate 80 in FIG. 8. The packaging substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 80. The overmold structure can encapsulate some or all of the components of the radio frequency module 75.

Figure 9:
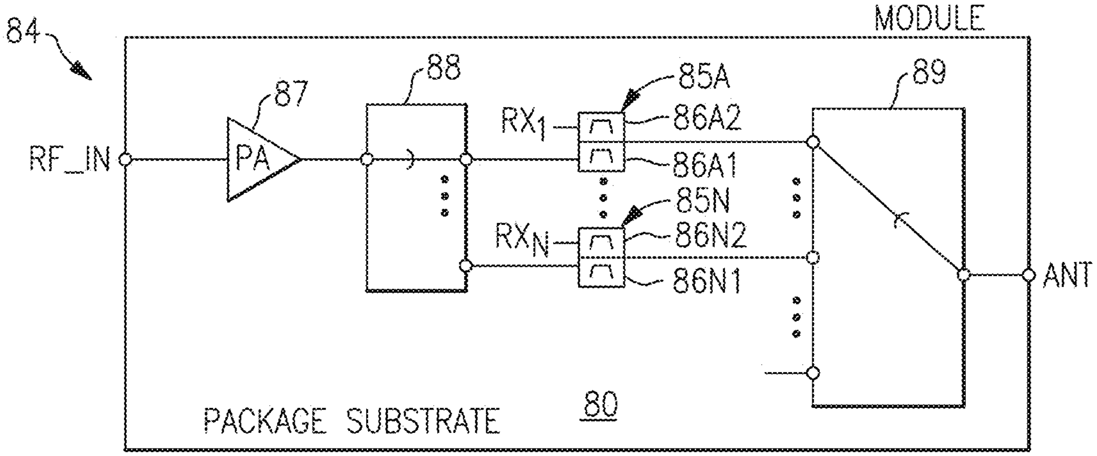
FIG. 9 is a schematic diagram of a radio frequency module that includes filters with surface acoustic wave resonators according to an embodiment.

FIG. 9 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 9 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 10A:
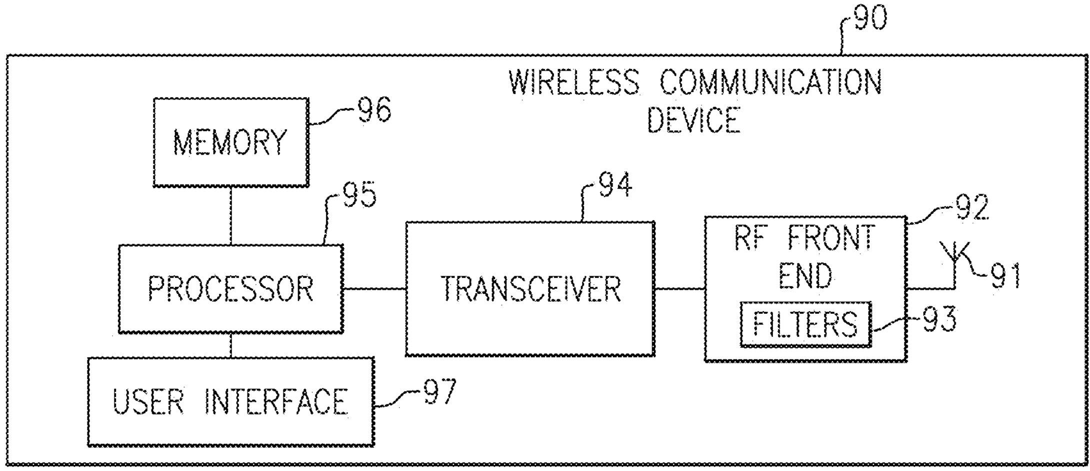
FIG. 10A is a schematic block diagram of a wireless communication device that includes a filter in accordance with one or more embodiments.

FIG. 10A is a schematic diagram of a wireless communication device 90 that includes filters 93 in a radio frequency front end 92 according to an embodiment. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals. Although not illustrated, the wireless communication device 90 can include a microphone and a speaker in certain applications.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 10B:
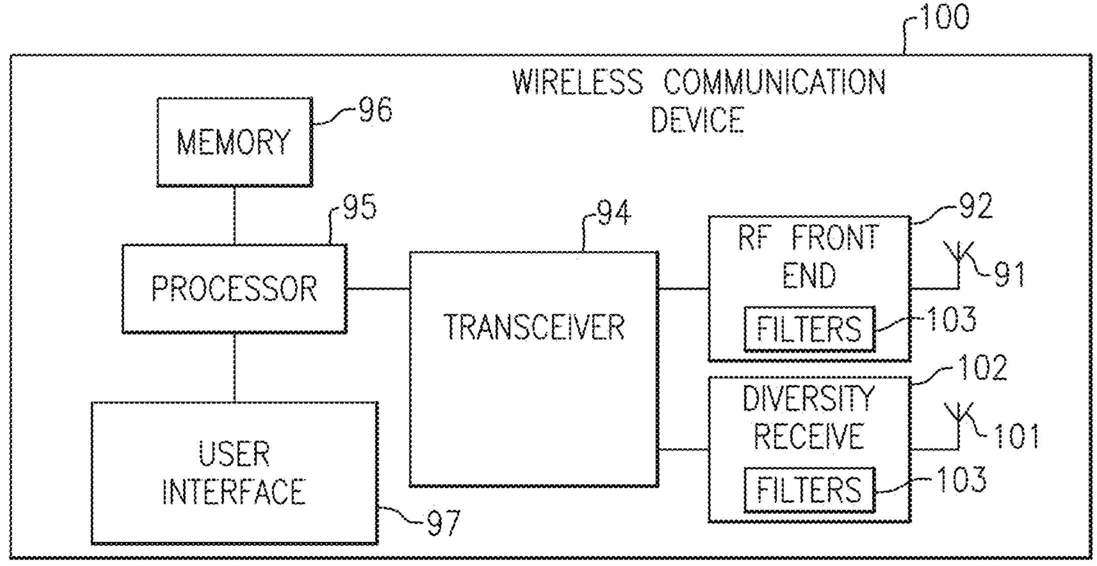
FIG. 10B is a schematic block diagram of another wireless communication device that includes a filter in accordance with one or more embodiments.

FIG. 10B is a schematic diagram of a wireless communication device 100 that includes filters 93 in a radio frequency front end 92 and a second filter 103 in a diversity receive module 102. The wireless communication device 100 is like the wireless communication device 90 of FIG. 10A, except that the wireless communication device 100 also includes diversity receive features. As illustrated in FIG. 10B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Figure 11:
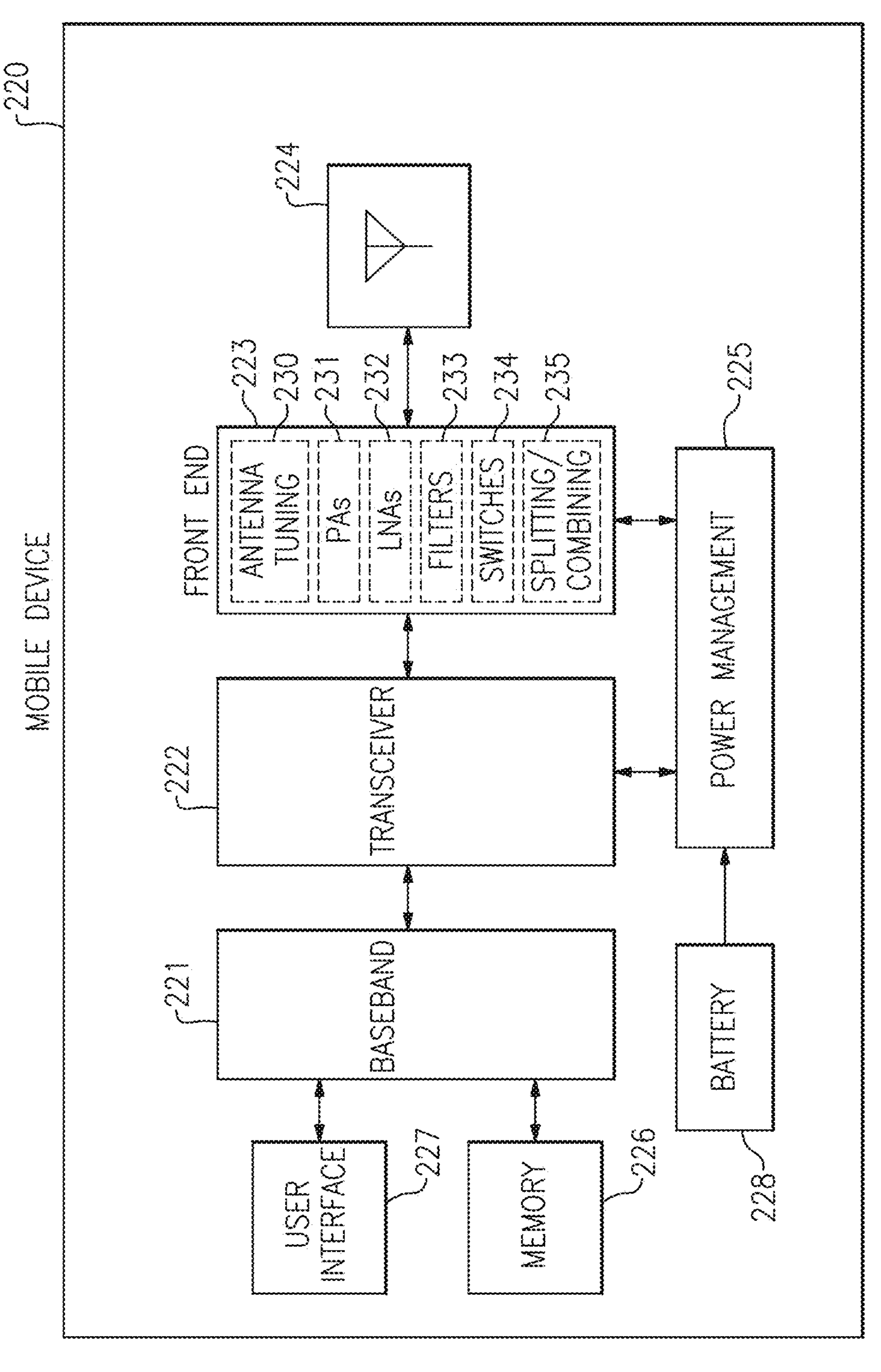
FIG. 11 is a schematic block diagram of a wireless communication device that includes a filter according to an embodiment.

FIG. 11 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 11 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAS) 231, low noise amplifiers (LNAs) 232, filters 233, switches 234, and signal splitting/combining circuitry 235. However, other implementations are possible. The filters 233 can include one or more acoustic wave filters that include any suitable number of acoustic wave devices in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 11, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 11, the power management system 225 receives a battery voltage from the battery 228. The battery 228 can be any suitable battery for use in the wireless communication device 220, including, for example, a lithium-ion battery.

Any suitable principles and advantages of the surface acoustic wave devices disclosed herein can be implemented with one or more temperature compensated SAW resonators. Temperature compensated SAW resonators include a temperature compensation layer (e.g., a silicon dioxide layer) over an interdigital transducer electrode to bring a temperature coefficient of frequency closer to zero.

Packaged surface acoustic wave devices disclosed herein can include one or more surface acoustic wave resonators included in a filter arranged to filter a radio frequency signal in a fourth generation (4G) Long Term Evolution (LTE) operating band. Packaged surface acoustic wave devices disclosed herein can include one or more surface acoustic wave resonators included in a filter arranged to filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. Packaged surface acoustic wave devices disclosed herein can include one or more surface acoustic wave resonators included in a filter with a passband corresponding to both a 4G LTE operating band and a 5G NR operating band within FR1.

Any of the embodiments disclosed herein can combined. Any of the embodiments described above can be implemented in association with a radio frequency system and/or mobile devices such as cellular handsets. The principles and advantages of the embodiments can be used for any systems or apparatus that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals in a frequency range from about 30 KHz to 300 GHz, such as in a frequency range from about 450 MHz to 8.5 GHz, a frequency range from about 450 MHz to 2.5 GHx, or a frequency range from about 450 MHz to 3 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, a peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure.

For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave device comprising:

a piezoelectric layer;

a first interdigital transducer electrode and a second interdigital transducer electrode in electrical communication with the piezoelectric layer;

a reflector positioned between the first and second interdigital transducer electrodes such that the first interdigital transducer electrode, the second interdigital transducer electrode, and the reflector are aligned along a longitudinal direction; and a temperature compensation layer over the first interdigital transducer electrode, the second interdigital transducer electrode, and the reflector, the temperature compensation layer having a first region with a first thickness overlapping at least the first interdigital transducer electrode and a first portion of the reflector, a second region with a second thickness overlapping at least the second interdigital transducer electrode and a second portion of the reflector, and a sidewall between the first region and the second region, the first thickness being greater than the second thickness, at least a portion of the sidewall extending non-perpendicular to the longitudinal direction.

2. The surface acoustic wave device of claim 1 wherein fingers of the reflector extend in a transverse direction perpendicular to the longitudinal direction.

3. The surface acoustic wave device of claim 2 wherein the sidewall overlaps at least one finger of the fingers and one spacing between the finger and an adjacent finger.

4. The surface acoustic wave device of claim 2 wherein the sidewall extends in a direction that is angled in a range between 1° and 15° from the transverse direction.

5. The surface acoustic wave device of claim 2 wherein the sidewall has a plurality of angled sections that are angled relative to a respective adjacent section.

6. The surface acoustic wave device of claim 5 wherein each section of the plurality of angled sections is angled relative to the transverse direction.

7. The surface acoustic wave device of claim 1 wherein a difference between the first thickness and the second thickness is in a range between 100 nm and 500 nm.

8. The surface acoustic wave device of claim 1 wherein a difference between the first thickness and the second thickness is in a range between 100 nm and 300 nm.

9. The surface acoustic wave device of claim 1 wherein the sidewall is sloped from the first region to the second region.

10. The surface acoustic wave device of claim 1 further comprising a third interdigital transducer electrode coupled longitudinally with the first and second interdigital transducer electrodes, and a second reflector between the second interdigital transducer electrode and the third interdigital transducer electrode.

11. The surface acoustic wave device of claim 10 wherein the temperature compensation layer further includes a third region having a third thickness that overlaps at least the third interdigital transducer electrode and a portion of the second reflector, and a second sidewall between the second region and the third region, the third thickness is different from the second thickness.

12. The surface acoustic wave device of claim 1 wherein the first and second interdigital transducer electrodes have different lateral sizes.

13. A surface acoustic wave device comprising:

a piezoelectric layer;

a first interdigital transducer electrode and a second interdigital transducer electrode in electrical communication with the piezoelectric layer;

a reflector positioned between the first and second interdigital transducer electrodes, the reflector including a plurality of fingers extending in a first direction; and a temperature compensation layer over the first interdigital transducer electrode, the second interdigital transducer electrode, and the reflector, the temperature compensation layer having a first region with a first thickness overlapping at least the first interdigital transducer electrode and a first portion of the reflector, a second region with a second thickness overlapping at least the second interdigital transducer electrode and a second portion of the reflector, and a sidewall between the first region and the second region, the first thickness being different from the second thickness, at least a portion of the sidewall extending in a second direction non-parallel to the first direction.

14. The surface acoustic wave device of claim 13 wherein the second direction is angled in a range between 1° and 15° from the first direction.

15. The surface acoustic wave device of claim 13 wherein the sidewall overlaps at least one finger of the fingers and one spacing between the finger and an adjacent finger.

16. The surface acoustic wave device of claim 13 wherein the sidewall has a plurality of angled sections that are angled relative to a respective adjacent section.

17. The surface acoustic wave device of claim 16 wherein each section of the plurality of angled sections is angled relative to the first direction.

18. The surface acoustic wave device of claim 16 wherein a difference between the first thickness and the second thickness is in a range between 100 nm and 500 nm.

19. The surface acoustic wave device of claim 16 wherein the sidewall is sloped from the first region to the second region.

20. A surface acoustic wave device comprising:

a piezoelectric layer;

a first interdigital transducer electrode and a second interdigital transducer electrode in electrical communication with the piezoelectric layer;

a reflector positioned laterally between the first and second interdigital transducer electrodes in a longitudinal direction, the reflector including fingers extending in a transverse direction perpendicular to the longitudinal direction; and a temperature compensation layer over the first interdigital transducer electrode, the second interdigital transducer electrode, and the reflector, the temperature compensation layer having a first region over the first interdigital transducer electrode and a first portion of the reflector, a second region over at least the second interdigital transducer electrode and a second portion of the reflector, and a sidewall between the first region and the second region, the sidewall overlapping at least one finger of the fingers and one spacing between the finger and an adjacent finger.

* * * * *